(12) United States Patent
Jousseaume

(10) Patent No.: US 8,404,315 B2
(45) Date of Patent: *Mar. 26, 2013

(54) PROCESS FOR MANUFACTURING PERMEABLE DIELECTRIC FILMS

(75) Inventor: Vincent Jousseaume, Le Sappey en Chartreuse (FR)

(73) Assignee: Commissariat a l'Energie Atomique, Paris (FR)

( * ) Notice: Subject to any disclaimer, the term of this patent is extended or adjusted under 35 U.S.C. 154(b) by 435 days.

This patent is subject to a terminal disclaimer.

(21) Appl. No.: 12/353,862

(22) Filed: Jan. 14, 2009

(65) Prior Publication Data

US 2009/0181187 A1    Jul. 16, 2009

(30) Foreign Application Priority Data

Jan. 16, 2008    (FR) ..................................... 08 50248

(51) Int. Cl.
*H05H 1/24* (2006.01)
*C23C 8/00* (2006.01)

(52) U.S. Cl. ......................... 427/579; 427/588; 427/589

(58) Field of Classification Search .................. 427/579, 427/588, 589
See application file for complete search history.

(56) References Cited

U.S. PATENT DOCUMENTS

| | | | | |
|---|---|---|---|---|
| 5,559,055 | A * | 9/1996 | Chang et al. ................... | 438/586 |
| 6,013,418 | A * | 1/2000 | Ma et al. ......................... | 430/323 |
| 6,159,871 | A * | 12/2000 | Loboda et al. ................ | 438/786 |
| 6,204,165 | B1 | 3/2001 | Ghoshal | |
| 6,514,855 | B1 | 2/2003 | Suzuki et al. | |
| 6,627,532 | B1 * | 9/2003 | Gaillard et al. ............... | 438/623 |
| 2002/0022378 | A1 | 2/2002 | Baklanov et al. | |
| 2002/0061654 | A1 * | 5/2002 | Kanegae et al. .............. | 438/710 |
| 2003/0042613 | A1 | 3/2003 | Shioya et al. | |
| 2004/0175883 | A1 | 9/2004 | Kim | |
| 2004/0266184 | A1 * | 12/2004 | RamachandraRao et al. .............................. | 438/689 |
| 2005/0074961 | A1 | 4/2005 | Beyer et al. | |
| 2006/0154484 | A1 * | 7/2006 | Hwang et al. ................. | 438/689 |
| 2006/0165891 | A1 * | 7/2006 | Edelstein et al. ........... | 427/248.1 |
| 2007/0045861 | A1 | 3/2007 | Ohto et al. | |
| 2008/0142929 | A1 * | 6/2008 | Jeannot et al. ................ | 257/632 |
| 2008/0314520 | A1 | 12/2008 | Chiba et al. | |

FOREIGN PATENT DOCUMENTS

EP    1 457 583 A2    9/2004

OTHER PUBLICATIONS

French Patent Office Search Report, dated Sep. 4, 2008.
Office Action for co-pending U.S. Appl. No. 12/353,872 dated Aug. 2, 2011.
Notice of Allowance and Fees Due for co-pending U.S. Appl. No. 12/353,872 dated Apr. 11, 2012, 8 pages.

* cited by examiner

*Primary Examiner* — Timothy Meeks
*Assistant Examiner* — Mandy Louie
(74) *Attorney, Agent, or Firm* — Brinks Hofer Gilson & Lione

(57) ABSTRACT

A process for manufacturing a permeable dielectric film, includes the deposition on a substrate of a film constituted of a material comprising silicon, carbon, hydrogen, oxygen and, possibly, nitrogen and/or fluorine, a majority of Si—C bonds and a proportion of Si—O bonds such that the oxygen present in said material represents less than 30 atom %; and the selective destruction with a chemical agent of the Si—O bonds present in the film. Applications include microelectronics and microtechnology, in any manufacturing process that involves the degradation of a sacrificial material by diffusion of a chemical agent through a film that is permeable to this agent, for the production of air gaps, in particular the manufacture of air-gap interconnects for integrated circuits.

14 Claims, No Drawings

PROCESS FOR MANUFACTURING PERMEABLE DIELECTRIC FILMS

TECHNICAL FIELD

The present invention relates to a process for manufacturing dielectric films that have, inter alia, the property of being permeable to the agents conventionally used for achieving chemical attack in the semiconductor industry, for instance hydrofluoric acid, while at the same time being resistant to these agents. These films have, in addition, a low permittivity ("low-k"), in particular a dielectric constant k generally less than or equal to 4.0.

By virtue of their properties, these films can be used in microelectronics and in microtechnology, in any manufacturing process involving the degradation of a sacrificial material by diffusion of a chemical attacking agent through a film that is permeable to this agent, for the production of air gaps. By way of example, such processes are used in the manufacture of air-gap interconnects for integrated circuits, microelectromechanical systems (MEMS) with resonant gaps of the BAW (Bulk Acoustic Wave) type, and also microbatteries

BACKGROUND

The manufacture of devices in microelectronics or microtechnology requires, in the more advanced solutions, the production of air gaps.

To produce these air gaps, one of the current approaches consists in degrading a sacrificial material, typically silicon oxide, by means of a chemical attacking agent, for example hydrofluoric acid, which must cross a membrane film to reach this material.

Besides being capable of allowing the passage of the chemical attacking agent, this membrane must satisfy very precise specifications, namely, it must:

be itself resistant to the chemical attacking agent, be compatible with the various processes and treatments used for producing the structure into which it is incorporated (metallizations, mechanochemical polishing, thermal annealing, and the like) and, in particular, be stable at temperatures that may be up to 400° C., have satisfactory mechanical properties since it forms part of the framework of the structure, and have a low dielectric constant, i.e. not more than 4.0, in the case of an interconnect structure for an integrated circuit.

The permeable membranes currently used are generally polymers of polyphenylene type that are deposited via the spin-coating technique. These polymers have a high coefficient of thermal expansion and low mechanical properties. Thus, their expansion during the thermal annealing steps generates stresses in the structures that can result in delamination at the interfaces.

Furthermore, the spin-coating technique is not a favoured technique of the semiconductor industry in the case of materials that are intended to remain inside devices, chemical or physical vapour deposition techniques being largely preferred.

SUMMARY

One subject of the invention is, precisely, a process for manufacturing a dielectric film that satisfies all the specifications requirements mentioned previously, without having to resort to the spin-coating technique.

This process comprises:
a) the deposition on a substrate of a film of a material comprising silicon, carbon, hydrogen, oxygen and, possibly, nitrogen and/or fluorine, a majority of silicon-carbon bonds and a proportion of silicon-oxygen bonds such that the oxygen present in said material represents not more than 30% by number of atoms; and then
b) the selective destruction with a chemical agent of the silicon-oxygen bonds present in the film formed in step a), enabling this film to be given an open porosity throughout its thickness and thus to be made permeable.

In the text hereinabove and hereinbelow, a material is considered as comprising a majority of silicon-carbon bonds when more than 50% of the bonds formed by the silicon atoms present in this material are silicon-carbon bonds.

In accordance with the invention, the material comprising silicon, carbon, hydrogen, oxygen and, possibly, nitrogen and/or fluorine is preferably of the type $Si_vC_wH_yO_z$ or $Si_vC_wN_xH_yO_z$ with v, w, x, y and z all being other than 0.

Films constituted of a material of this type may be deposited on a substrate especially via the plasma-enhanced chemical vapour deposition technique (PECVD).

To obtain a film of the type $Si_vC_wH_yO_z$, use is then preferably made of a plasma containing a first organosilicon precursor free of oxygen and a second precursor constituted of oxygen, alone or in combination with carbon and/or hydrogen, whereas, to obtain a film of the type $Si_vC_wN_xH_yO_z$, it is preferred to add to this plasma a third precursor constituted of nitrogen, alone or in combination with hydrogen and/or carbon.

By way of example, the first precursor may be an alkylsilane such as dimethylsilane, trimethylsilane or tetramethylsilane; the second precursor may be oxygen or carbon dioxide, while the third precursor may be nitrogen or ammonia.

In any case, the proportions of the various precursors in the plasma are appropriately chosen such that the atomic concentration of oxygen is less than 30% in the film obtained after step a).

As a variant, it is also possible to obtain a film of the type $Si_vC_wH_yO_z$ with a plasma containing only one precursor constituted of silicon, carbon, hydrogen and oxygen, but having an oxygen content of less than or equal to 30 atom %, for instance diethoxymethylsilane or octamethylcyclotetrasiloxane. Similarly, it is possible to obtain a film of the type $Si_vC_wN_xH_yO_z$ using this precursor together with another precursor constituted of nitrogen, alone or in combination with hydrogen and/or carbon.

In accordance with the invention, the plasma may also contain one or more inert vector gases, in particular helium and/or argon.

The deposition of the film by PECVD may especially be performed in a capacitive-coupling reactor. The operating parameters are then preferably as follows: an excitation of radiofrequency type at 13.56 MHz; a power of between 100 and 900 W, a temperature of between 100 and 450° C. for a pressure of between 1 and 10 ton (0.133 to 1.33 kPa) and precursor feed rates of between 1 and 10 000 cm³/minute.

After this deposition, the characteristics of the film, and especially its atomic concentration of oxygen, may be checked via composition analysis methods such as transmission infrared spectroscopy.

In accordance with the invention, the film preferably has a thickness ranging from 10 nm to 10 µm and better still from 100 nm to 1 µm.

As indicated previously, selective destruction of the silicon-oxygen bonds is then performed using a chemical agent, to make the film permeable. This chemical agent should therefore be capable of attacking the silicon-oxygen bonds present in this film while keeping the other bonds intact, and in particular the silicon-carbon, silicon-hydrogen and carbon-hydrogen bonds.

A chemical compound having this property is especially hydrofluoric acid, which is commonly used in the semiconductor industry and whose use is thus perfectly controlled.

Thus, the chemical agent used in step b) is preferably a fluid containing hydrofluoric acid.

In accordance with the invention, this fluid is preferably an aqueous or organic hydrofluoric acid solution, for example containing 1 or a few % (v/v) of HF, in which case step b) may be performed by simple dipping of the film in this solution.

However, it may also be hydrogen fluoride gas, in pure form or mixed with a carrier gas such as nitrogen, or a mixture of hydrogen fluoride and of supercritical carbon dioxide, for example in a ratio of 1/100 (v/v).

As a variant, the chemical agent may also be a fluid containing ammonium fluoride, optionally as a mixture with hydrofluoric acid.

In accordance with the invention, the substrate is advantageously a silicon substrate possibly comprising silicon oxide structures. Thus, the substrate may especially be a silicon substrate comprising a level of interconnects formed from metallic lines, for example copper, buried in a layer of silicon oxide.

In addition to the advantages mentioned previously, the process according to the invention also has the advantage of being simple to perform, especially since the deposition step a) consists in depositing only one material onto the substrate.

Other characteristics and advantages of the invention will emerge more clearly on reading the rest of the description that follows, which relates to examples of implementation of the process according to the invention.

Needless to say, these examples are given merely as illustrations of the subject matter of the invention and do not in any way constitute a limitation of this subject matter.

DETAILED DESCRIPTION

Example 1

A thin layer 100 nm thick of $Si_vC_wN_xH_yO_z$, having an oxygen content of about 10 to 20 atom %, is deposited on a silicon substrate by PECVD using tetramethylsilane, oxygen, ammonia and helium.

The deposition is performed in one of the capacitive-coupled PECVD deposition chambers of a Centura® 5200 DxZ machine from the company Applied Materials, using the following operating parameters:
  excitation radiofrequency: 13.56 MHz
  working pressure: 3 ton (0.4 kPa)
  power: 310 W
  deposition temperature: 350° C.
  tetramethylsilane flow rate: 80 cm³/min
  oxygen flow rate: 10 cm³/min
  ammonia flow rate: 160 cm³/min
  helium flow rate: 200 cm³/min
  deposition time: 1 minute.

After the deposition, the thin layer and the subjacent substrate are immersed in an aqueous solution containing 1% (v/v) of HF for 10 minutes.

A dielectric film that has a dielectric constant (measured with a mercury probe) of less than 4.0 and an open porosity estimated at 15% is thus obtained on the substrate.

Example 2

A thin layer 200 nm thick of $Si_vC_wH_yO_z$, having an oxygen content of about 15 atom %, is deposited on a silicon substrate comprising a plurality of poles made of metal or of a dielectric material, buried in a layer of $SiO_2$, via PECVD using trimethylsilane, $CO_2$ and helium.

The deposition is performed in one of the capacitive-coupled PECVD deposition chambers of a 300 mm Producer SE machine from the company Applied Materials, using the following operating parameters:
  excitation radiofrequency: 13.56 MHz
  working pressure: 8.7 torr (1.06 kPa)
  power: 585 W
  deposition temperature: 350° C.
  trimethylsilane flow rate: 210 cm³/min
  carbon dioxide flow rate: 10 cm³/min
  helium flow rate: 600 cm³/min
  deposition time: 1 minute.

After the deposition, the thin layer and the subjacent substrate are immersed in an aqueous solution containing 1% (v/v) of hydrofluoric acid for 20 minutes, this time being determined as a function of the thickness of the $SiO_2$ zones to be dissolved (about 1 minute per 10 nm of $SiO_2$) and allowing 5 minutes of treatment for the destruction of the Si—O bonds of the thin layer.

A dielectric film that is free (due to the dissolution of the $SiO_2$ zones), while at the same time being maintained on the substrate by the metal or dielectric poles of this substrate, is thus obtained. This film has a dielectric constant (measured with a mercury probe) of less than 4.0 and an open porosity estimated at 10%.

The invention claimed is:

1. A process for manufacturing a permeable dielectric film on a substrate, the film having an open porosity, the process comprising:
  a) depositing a dielectric film on the substrate, the film comprising silicon, carbon, hydrogen, and oxygen atoms, wherein the silicon atoms form bonds with the carbon atoms and the oxygen atoms and wherein more than 50% of bonds formed by the silicon atoms are silicon-carbon bonds and wherein the number of oxygen atoms is less than 30% of a total number of the atoms; and
  b) applying a chemical etching agent to the dielectric film to break the bonds formed by the silicon atoms with the oxygen atoms in the dielectric film without breaking the bonds formed by the silicon atoms with the carbon atoms and to obtain thereby the dielectric film having an open porosity.

2. The process according to claim 1, wherein the dielectric film comprises $Si_vC_wH_yO_z$ or $Si_vC_wN_xH_yO_z$, where v, w, x, y and z are nonzero subscripts.

3. The process according to claim 1, wherein depositing the dielectric film on the substrate comprises a plasma-enhanced chemical vapour deposition process.

4. The process according to claim 3, wherein the dielectric film comprises $Si_vC_wH_yO_z$ where v, w, y and z are nonzero subscripts, and wherein depositing the dielectric film on the substrate comprises plasma deposition, wherein the plasma comprises a first organosilicon precursor free of oxygen and a second precursor comprising oxygen alone or in combination with carbon or hydrogen, or both.

5. The process according to claim 4, wherein the first precursor comprises an alkylsilane and the second precursor comprises oxygen or carbon dioxide.

6. The process according to claim 3, wherein the dielectric film comprises $Si_vC_wN_xH_yO_z$ where v, w, x, y and z are nonzero subscripts, and wherein depositing the dielectric film on the substrate comprises plasma deposition, wherein the plasma comprises a first organosilicon precursor free of oxygen, a second precursor comprising oxygen alone or in combination with carbon or hydrogen, or both, and a third precursor comprising nitrogen alone or in combination with hydrogen or carbon, or both.

7. The process according to claim 6, wherein the first precursor comprises an alkylsilane, the second precursor comprises oxygen or carbon dioxide and the third precursor comprises nitrogen or ammonia.

8. The process according to claim 1, wherein applying the chemical etching agent, comprises applying a fluid comprising hydrofluoric acid.

9. The process according to claim 8, wherein the fluid comprises an aqueous or organic hydrofluoric acid solution.

10. The process according to claim 8, wherein the fluid comprises pure hydrogen fluoride gas, a mixture of hydrogen fluoride gas and a carrier gas, or a mixture of hydrogen fluoride and supercritical carbon dioxide.

11. The process according to claim 1, wherein applying the chemical etching agent comprises applying a fluid comprising ammonium fluoride.

12. The process according to claim 1, wherein the substrate comprises a silicon substrate and optionally comprising silicon oxide structures.

13. The process according to claim 1, wherein the dielectric film obtained by step b) has a dielectric constant k less than or equal to 4.0 and an open porosity of 10% to 15%.

14. A process for manufacturing air-gap interconnects for integrated circuits, which comprises the use of a process according to claim 1.

* * * * *